United States Patent
Choong et al.

(10) Patent No.: US 7,679,282 B2
(45) Date of Patent: Mar. 16, 2010

(54) POLYMER AND SMALL MOLECULE BASED HYBRID LIGHT SOURCE

(75) Inventors: Vi-En Choong, Carlsbad, CA (US); Stelios Choulis, Nuremberg (DE); Benjamin Claus Krummacher, Regensburg (DE); Mathew Mathai, Monroeville, PA (US); Franky So, Gainesville, FL (US)

(73) Assignee: Osram Opto Semiconductors GmbH, Regensburg (DE)

( * ) Notice: Subject to any disclaimer, the term of this patent is extended or adjusted under 35 U.S.C. 154(b) by 559 days.

(21) Appl. No.: 11/294,904

(22) Filed: Dec. 5, 2005

(65) Prior Publication Data

US 2006/0199036 A1 Sep. 7, 2006

Related U.S. Application Data

(60) Provisional application No. 60/657,803, filed on Mar. 2, 2005.

(51) Int. Cl.
*H01L 51/54* (2006.01)
*H01L 51/52* (2006.01)

(52) U.S. Cl. .............. 313/504; 313/503; 313/506; 428/690

(58) Field of Classification Search ........... 313/503, 313/504, 506, 509; 428/690
See application file for complete search history.

(56) References Cited

U.S. PATENT DOCUMENTS

| | | | | |
|---|---|---|---|---|
| 5,587,444 | A * | 12/1996 | Uchida et al. | 428/690 |
| 6,207,301 | B1 * | 3/2001 | Ohnishi et al. | 428/690 |
| 6,486,601 | B1 * | 11/2002 | Sakai et al. | 313/504 |
| 6,680,578 | B2 | 1/2004 | Antoniadis et al. | |
| 6,746,784 | B2 * | 6/2004 | Toguchi et al. | 428/690 |
| 6,794,676 | B2 | 9/2004 | Pakbaz et al. | |
| 6,955,856 | B2 * | 10/2005 | Lee et al. | 428/690 |
| 2002/0045719 | A1 * | 4/2002 | Hawker et al. | 428/690 |
| 2002/0117962 | A1 * | 8/2002 | Beierlein et al. | 313/504 |
| 2003/0157365 | A1 * | 8/2003 | Kinoshita et al. | 428/690 |
| 2004/0081854 | A1 * | 4/2004 | Hirose et al. | 428/690 |
| 2004/0131881 | A1 * | 7/2004 | Zheng et al. | 428/690 |
| 2004/0202893 | A1 | 10/2004 | Abe | |

(Continued)

FOREIGN PATENT DOCUMENTS

EP 1 339 112 A2 8/2003

(Continued)

OTHER PUBLICATIONS

Michael S. Bayerl et al., "Crosslinkable hole-transport materials for preparation of multilayer organic light emitting devices by spin-coating", 1999, Macromolecular Rapid Communication, vol. 20, No. 4, pp. 224-228.

(Continued)

*Primary Examiner*—Mariceli Santiago
(74) *Attorney, Agent, or Firm*—Fish & Richardson P.C.

(57) ABSTRACT

An organic electroluminescent device, includes: a substrate; a hole-injecting electrode (anode) coated over the substrate; a hole injection layer coated over the anode; a hole transporting layer coated over the hole injection layer; a polymer based light emitting layer, coated over the hole transporting layer; a small molecule based light emitting layer, thermally evaporated over the polymer based light emitting layer; and an electron-injecting electrode (cathode) deposited over the electroluminescent polymer layer.

26 Claims, 2 Drawing Sheets

U.S. PATENT DOCUMENTS

| | | | |
|---|---|---|---|
| 2005/0006641 A1 | 1/2005 | Tung et al. | |
| 2005/0040758 A1* | 2/2005 | Wolk et al. | 313/506 |
| 2005/0142384 A1* | 6/2005 | Itai | 428/690 |
| 2006/0043885 A1 | 3/2006 | Poplavskyy et al. | |
| 2006/0043887 A1 | 3/2006 | Patwardhan et al. | |
| 2006/0197437 A1 | 9/2006 | Krummacher et al. | |

FOREIGN PATENT DOCUMENTS

| | | | |
|---|---|---|---|
| JP | 2001257076 A * | 9/2001 | |
| WO | WO 02/45185 A2 | 6/2002 | |
| WO | WO 2005/004193 A2 | 1/2005 | |

OTHER PUBLICATIONS

Atsushi Kimoto et al., "Synthesis and Electroluminescence Properties of Novel Main Chain Poly (p-phenylenevinylene)s Possessing Pendant Phenylazomethine Dendrons as Metal Ligation Sites", 2004, Chem. Mater. vol. 16, No. 26, pp. 5706-5712.

Shizuo Tokito et al., "High-efficiency phosphorescent polymer light-emitting devices", 2003, Organic Electronics, vol. 4, pp. 105-111.

Ya-Dong Zhang et al., "Photo-crosslinkable polymers as hole-transport materials for organic light-emitting diodes", 2002, Journal of Materials Chemistry, vol. 12, pp. 1703-1708.

Communication re Extended European Search Report for Application No. EP 06004272.8, dated Nov. 11, 2009, 11 pages.

* cited by examiner

POLYMER AND SMALL MOLECULE BASED HYBRID LIGHT SOURCE

RELATED APPLICATIONS

This application claims priority from a U.S. provisional patent application entitled "Polymer small molecule based hybrid light source" bearing Ser. No. 60/657,803, filed on Mar. 2, 2005.

GOVERNMENT RIGHTS

This invention was made with Government support under Contract No. DE-FC26-04NT41947 awarded by the Department of Energy. The Government may have certain rights in the invention.

BACKGROUND

1. Field of the Invention

This invention relates generally to the art of thin film device processing and fabrication. More specifically, the invention relates to the structure of Organic Light Emitting Diode devices and displays.

2. Related Art

Conjugated polymers and small-molecules are of increasing interest as new materials for organic light electronic devices. Conventional devices based on polymer used solution processing techniques and small molecules devices thermal evaporation techniques. The simplest solution processed polymer based OLED incorporates an active region with a light emitting polymer and/or small molecules blended into a solution that is coated onto the transparent anode by spin-casting or printing methods. In several cases a hole transporting interlayer is included between the anode/anode buffer layer and the active region in order to improve hole injection and transport. In contrast, small molecule devices typically consist of several stacked organic layers, each one optimized to perform a particular function. In polymer OLEDs, it is difficult to adjust the color and light output.

DETAILED DESCRIPTION

Figure 1:
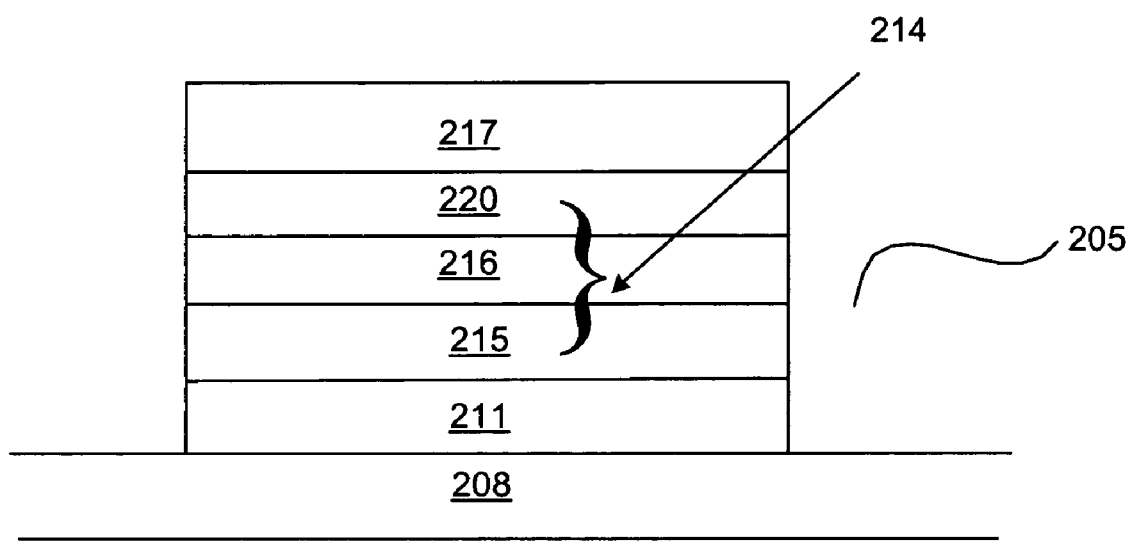
FIG. 1 shows a cross-sectional view of an embodiment of an EL device 205 according to at least one embodiment of the invention.

In one or more embodiments of the invention, what is disclosed is a novel hybrid electroluminescent (EL) device primarily based on solution-processed polymer active layers, including a polymer-based light emitting layer but incorporating an additional small molecule layer fabricated on the top of the polymer-based light emitting layer. In some embodiments, the small molecule layer is fabricated by thermal evaporation techniques. The present invention is motivated in the design of organic light sources to obtain high efficiency, with desired emission spectra. One novel aspect of the invention includes incorporation of an additional emissive small molecule-based layer above the polymer-based active region in a polymer based lighting device such as an OLED. In this way, the color spectrum can be easily be tuned as desired by adding just one extra deposition step. The remaining device structure is still fabricated using advantageous solution processing techniques.

In accordance with one embodiment of the invention, the structure of a novel hybrid organic electroluminescent device comprises of an anode (e.g. indium-tin-oxide (ITO)), an anode buffer layer (e.g. PEDOT:PSS (polyethylenedioxythiopene), PANI (conducting polyaniline)), a hole transporting interlayer (e.g. an amine-based organic material), a polymer-based light emissive layer (this layer can be doped with additional carrier transport and emitting moieties), a small molecule-based light emissive layer and a cathode layer (e.g. barium covered with aluminum). The function of the anode buffer layer is to provide efficient hole injection into subsequent layers and also acts as a buffer layer to smooth the surface of the anode and to provide a better adhesion for the subsequent layer. The function of the hole transporting interlayer is to transport holes, injected from the anode buffer layer, to the polymer-based light emissive layer, where recombination with electrons will occur and light will be emitted. The hole transporting interlayer usually consists of a high hole mobility organic material, such as TPD, NPD, amine-based starburst compounds, amine-based spiro-compounds, and so on. Another function of the hole transporting interlayer is to move the recombination zone away from the interface with the anode buffer layer. In alternate embodiments of this invention, the hole transporting interlayer may be excluded from the device structure. The function of the polymer-based light emissive layer is to transport both types of carriers and to efficiently produce light of desirable wavelength from electron-hole pair (exciton) recombination. The function of the small molecule-based light emissive layer is to transport both types of carriers and to efficiently produce light which complements the emission of the polymer-based light emissive layer. The function of the electron injection layer is to efficiently inject electrons into the electroluminescent layer. The small molecule-based light emissive layer can be emissive and also serve the role of hole blocking.

OLED device 205 includes substrate 208 and a first electrode 211 on the substrate 208. The first electrode 211 may be patterned for pixilated applications or un-patterned for backlight or other general lighting applications. The OLED device 205 also includes a semiconductor stack 214 on the first electrode 211. The semiconductor stack 214 includes at least the following: (1) an anode buffer layer (ABL) 215, (2) a polymer-based light emissive layer (EML) 216 and (3) a small molecule-based light emissive layer (SMEML) 220.

As shown in FIG. 1, the OLED device 205 is a bottom-emitting device. As a bottom-emitting device, the first electrode 211 would act as an anode, and the ABL 215 would be disposed on the first electrode 211, the EML 216 would be disposed on the ABL 215, and the SMEML 220 would be disposed on the EML 216. The OLED device 205 also includes a second electrode 217 on the semiconductor stack 214. Other layers than that shown in FIG. 1 may also be added such as insulating layers, barrier layers, electron/hole injection and blocking layers, getter layers, and so on. Exemplary embodiments of these layers are described in greater detail below.

Substrate 208:

The substrate 208 can be any material, which can support the additional layers and electrodes, and is transparent or semi-transparent to the wavelength of light emitted by the OLED device 205. Preferable substrate materials include glass, quartz, silicon, and plastic, preferably, thin, flexible glass. The preferred thickness of the substrate 208 depends on the material used and on the application of the device. The substrate 208 can be in the form of a sheet or continuous film. The continuous film is used, for example, for roll-to-roll manufacturing processes which are particularly suited for plastic, metal, and metallized plastic foils.

First Electrode 211:

In the bottom-emitting configuration, the first electrode 211 functions as an anode (the anode is a conductive layer which serves as a hole-injecting layer). Typical anode materials include metals (such as platinum, gold, palladium, indium, and the like); metal oxides (such as lead oxide, tin oxide, indium-tin oxide, and the like); graphite; doped inorganic semiconductors (such as silicon, germanium, gallium arsenide, and the like); and doped conducting polymers (such as polyaniline, polypyrrole, polythiophene, and the like). Preferably, the first electrode 211 is comprised of indium-tin oxide (ITO).

The first electrode 211 is preferably transparent or semi-transparent to the wavelength of light generated by the OLED device 205. Preferably, the thickness of the first electrode 211 is from about 10 nanometers ("nm") to about 1000 nm, more preferably from about 50 nm to about 200 nm, and most preferably is about 100 nm to 150 nm.

The first electrode layer 211 can typically be fabricated using any of the techniques known in the art for deposition of thin films, including, for example, vacuum evaporation, sputtering, electron beam deposition, or chemical vapor deposition, using for example, pure metals or alloys, or other film precursors.

ABL 215:

The ABL 215 has good hole conducting properties and is used to effectively inject holes from the first electrode 211 to the EML 216. The ABL 215 is made of polymers or small molecule materials or other organic or partially organic material. For example, the ABL 215 can be made from tertiary amine or carbazole derivatives both in their small molecule or their polymer form, conducting polyaniline ("PANI"), or PEDOT:PSS (a solution of poly(3,4-ethylenedioxythiophene) ("PEDOT") and polystyrenesulfonic acid ("PSS") (available as Baytron P from HC Starck). The ABL 215 can have a thickness from about 5 nm to about 1000 nm, and is conventionally used from about 50 to about 250 nm.

Other examples of the ABL 215 include any small molecule materials and the like such as plasma polymerized fluorocarbon films (CFx) with preferred thicknesses between 0.3 and 3 nm, copper pthalocyanine (CuPc) films with preferred thicknesses between 10 and 50 nm.

The ABL 215 can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. A hole transporting and/or buffer material is deposited on the first electrode 211 and then allowed to dry into a film. The dried film represents the ABL 215. Other deposition methods for the ABL 215 include plasma polymerization (for CFx layers), vacuum deposition, or vapor phase deposition (e.g. for films of CuPc).

EML 216:

A polymer-based light emissive layer (EML) 216 is comprised of an organic electroluminescent material which emits light upon application of a potential across first electrode 211 and second electrode 217. The EML may be fabricated from materials organic or organo-metallic in nature such as monomers, oligomers, and polymers. As used herein, the term organic also includes organo-metallic materials. Light-emission in these materials may be generated as a result of fluorescence or phosphorescence. Examples of such organic electroluminescent materials include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) polyp-phenylene and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives; (xiii) co-polymers of polyquinoline with p-phenylene substituted on the phenylene with, for example, alkyl or alkoxy groups to provide solubility; and (xiv) rigid rod polymers such as poly(p-phenylene-2,6-benzobisthiazole), poly(p-phenylene-2,6-benzobisoxazole), polyp-phenylene-2,6-benzimidazole), and their derivatives.

Other organic emissive polymers such as those utilizing polyfluorene include that emit green, red, blue, or white light or their families, copolymers, derivatives, or mixtures thereof. Other polymers include polyspirofluorene-like polymers, their families, co-polymers and derivatives.

The thickness of the EML 216 can be from about 5 nm to about 500 nm, preferably, from about 20 nm to about 100 nm, and more preferably is about 75 nm. The EML 216 can be a continuous film that is non-selectively deposited (e.g. spin-coating, dip coating etc.) or discontinuous regions that are selectively deposited (e.g. by ink-jet printing).

In some embodiments, the EML 216 can be composed of at least two light emitting elements chosen, for example, from those listed above. In the case of two light-emitting elements, the relative concentration of the host element and the dopant element can be adjusted to obtain the desired color. The EML 216 can be fabricated by blending or mixing the elements, either physically, chemically, or both. The EML 216 can emit light in any desired color and be comprised of polymers, co-polymers, dopants, quenchers, and hole transport materials as desired. For instance, the EML 216 can emit light in blue, red, green, orange, yellow or any desired combination of these colors and in some applications, may include a combination of emitting elements which produce white light.

In addition to active electroluminescent materials that emit light, EML 216 can also include materials capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, triphenylamine, and triphenyldiamine. EML 216 may also include semiconductors, such as silicon, gallium arsenide, cadmium selenide, or cadmium sulfide.

Small Molecule-Based Emissive Layer (SMEML) 220

In accordance with the invention, a small molecule-based emissive layer (SMEML) 220 is fabricated over EML 216. SMEML 220 comprises one or more small organic molecules or materials that emit by fluorescence or by phosphorescence can serve as the organic electroluminescent layer. Examples of small-molecule organic electroluminescent materials include: (i) tris(8-hydroxyquinolinato) aluminum (Alq); (ii) 1,3-bis(N,N-dimethylaminophenyl)-1,3,4-oxadazole (OXD-8); (iii)-oxo-bis(2-methyl-8-quinolinato)aluminum; (iv) bis (2-methyl-8-hydroxyquinolinato) aluminum; (v) bis(hydroxybenzoquinolinato) beryllium ($BeQ_2$); (vi) bis (diphenylvinyl)biphenylene (DPVBI); and (vii) arylamine-substituted distyrylarylene (DSA amine). SMEML 220 may also be fabricated by vapor deposition, sputtering, vacuum deposition, thermal evaporation and the like. SMEML 220 can be deposited or fabricated into a pattern by the use of shadow masking, for instance.

Second Electrode 217:

In the bottom-emitting configuration, the second electrode 217 functions as a cathode (the cathode is a conductive layer which serves as an electron-injecting layer and which comprises a material with a low work function). While the second electrode can be comprised of many different materials, preferable materials include aluminum, silver, gold, magnesium, calcium, cesium, barium, or combinations thereof. More preferably, the cathode is comprised of aluminum, aluminum alloys, or combinations of magnesium and silver. Additional cathode materials may contain fluorides such as LiF and the like. Second electrode 217 though shown as a single layer may be composed of a plurality of sub-layers composed of one or more of the above materials in any desirable combination.

The thickness of the second electrode 217 is from about 10 nm to about 1000 nm, preferably from about 50 nm to about 500 nm, and more preferably, from about 100 nm to about 300 nm. While many methods are known to those of ordinary skill in the art by which the second electrode 217 may be deposited, vacuum deposition and sputtering methods are preferred.

Figure 2:
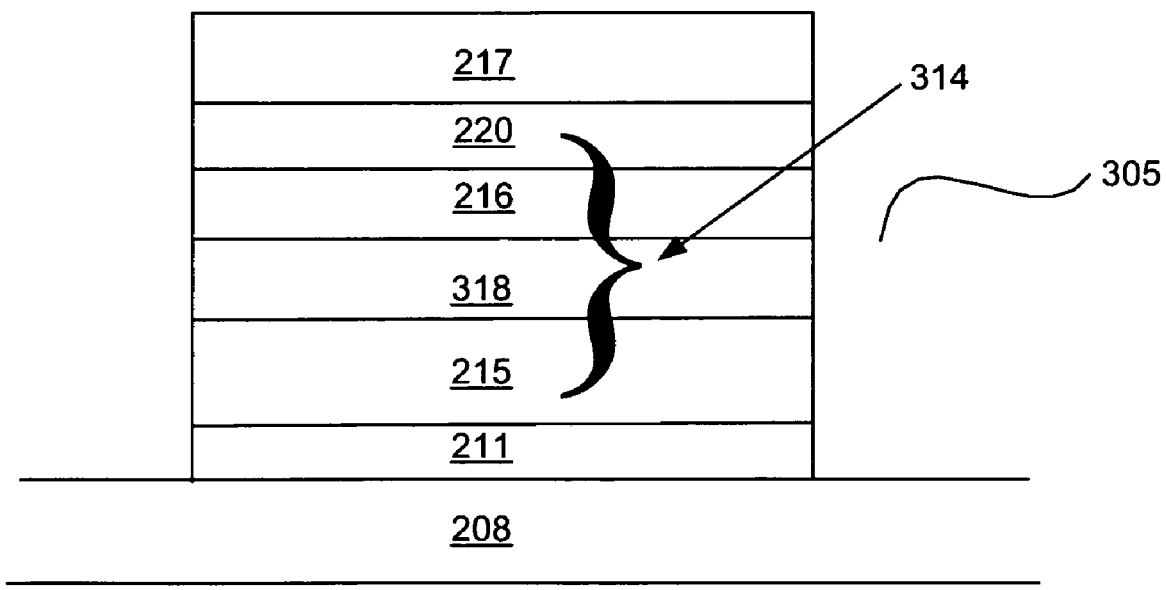
FIG. 2 shows a cross-sectional view of an embodiment of an electroluminescent (EL) device 305 according to at least one embodiment of the invention.

FIG. 2 shows a cross-sectional view of an embodiment of an electroluminescent (EL) device 305 according to at least one embodiment of the invention. Device 305 is similar or identical to device 205 in all aspects with like-numbered elements having the same or similar descriptions, except for the following. A semiconductor stack 314 comprises at least three layers EML 216, a hole transporting (HT) interlayer 318 and an anode buffer layer (ABL) 215.

HT Interlayer 318:

The functions of the HT interlayer 318 are among the following: to assist injection of holes into the EML 216, reduce exciton quenching, provide better hole transport than electron transport, and block electrons from getting into the ABL 215 and degrading it. Some materials may have one or two of the desired properties listed, but the effectiveness of the material as an interlayer is believed to improve with the number of these properties exhibited. The HT interlayer 318 may consist at least partially of or may derive from one or more following compounds, their derivatives, moieties, etc: polyfluorene derivatives, poly(2,7-(9,9-di-n-octylfluorene)-(1,4-phenylene-((4-secbutylphenyl)imino)-1,4-phenylene) and derivatives which include cross-linkable forms, non-emitting forms of poly(p-phenylenevinylene), triarylamine type material (e.g. triphenyldiamine (TPD), α-napthylphenyl-biphenyl (NPB)) mixed with a crosslinkable small molecule or polymer matrix, thiopene, oxetane-functionalized polymers and small molecules etc. The hole transporting materials used in the HT interlayer 318 are preferably polymer hole transporting materials, but can be small molecule hole transporting materials with a polymer binder. For example, polymers containing aromatic amine groups in the main chain or side chains are widely used as hole transporting materials. Preferably, the thickness for the HT interlayer 318 is 10-150 nm. More preferably the thickness for the HT interlayer 3518 is 20-60 nm. In some embodiments of the invention, the HT interlayer 318 is fabricated using a cross-linkable hole transporting polymer.

In accordance with at least one embodiment of the invention, HT interlayer 318 may also include one or more organic and/or inorganic conductivity dopants. In one or more embodiments, inorganic conductivity dopants comprise, for example, at least one of the following: ferric chloride ($FeCl_3$), ferric bromide ($FeBr_3$), antimony pentachloride ($SbCl_5$), arsenic pentachloride($AsCl_5$), boron trifluoride ($BF_3$), etc. In one or more embodiments, organic conductivity dopants comprise, for example, at least one of the following: 2,3,5,6-tetrafluoro-7,7,8,8-tetracyano-quinodimethane (F4-TCNQ), dicyanodichloroquinone, and trinitrofluorenone, etc.

The HT interlayer 318 is preferably cross-linked or otherwise physically or chemically rendered insoluble to prevent degradation of the HT interlayer 318 when exposed to the solvent used in fabrication of subsequent adjacent layers such as the EML 216. Cross-linking can be achieved by exposing the film or deposited solution of HT interlayer 318 to light, ultraviolet radiation, heat, or by chemical process. This may include the use of ultraviolet curable inks, crosslinkable side chains, crosslinkable chain end groups, monomers which can be cross-linked into polymers, cross-linking agents, initiators, polymer blends, polymer matrices and so on. The general process(es) of cross-linking organic materials is well-known, and will not be described further. As one possible alternative to cross-linking, the HT interlayer 318 can be rendered insoluble by adjusting its polarity in accordance with the polarity of the solvent (e.g. toluene, xylene etc.) that is to be used in fabricating the EML 216. The HT interlayer 318 can be fabricated prior to or in conjunction with the cross-linking process by ink-jet printing, by spin-coating or other proper deposition techniques.

The OLED display/device described earlier can be used within displays in applications such as, for example, computer displays, information displays in vehicles, television monitors, telephones, printers, and illuminated signs and in lighting applications for white and colored lighting, residential and general area lighting, back light applications, and industrial lighting.

What is claimed is:

1. An organic electroluminescent device comprising:
   a substrate;
   a hole-injecting electrode disposed over the substrate;
   a hole injecting anode buffer layer coated over the hole-injecting electrode;
   a hole transporting interlayer coated over the anode buffer layer, wherein the hole transporting interlayer includes a conductivity dopant;

a polymer-based light emissive layer coated over the hole transporting interlayer, wherein the polymer-based emissive layer contains a first material and a second material, the first material being a luminescent polymer and the second material being a molecule capable of charge transport, wherein the luminescent polymer is different from the molecule capable of charge transport;

a small molecule-based light emissive layer disposed over the polymer-based light ernissive layer; and an electron-injecting electrode disposed over the small molecule-based light emissive layer.

2. The device according to claim 1 wherein said small molecule based light emissive layer is replaced by a hole blocking layer doped with at least one emissive dopant.

3. The device according to claim 1 wherein said hole transporting interlayer comprises a copolymer of the hole transporting polymer and a blended organic derivative.

4. The device according to claim 1 wherein said hole transporting interlayer comprises at least one of a conjugated polythiophene polymer derivative, phenylvinylene polymer or fluorine, polyspiro, or co-polymer.

5. The device according to claim 1 wherein said hole transporting interlayer comprises a crosslinked polymer or a blend of polymers, at least one of which is crosslinked.

6. The device according to claim 1, wherein the polymer-based light emissive layer comprises at least one of a non-conjugated polymer, conjugated PPV, conjugated fluorene, conjugated poly-spiro or co-polymer.

7. The device according to claim 1 wherein the polymer-based light emissive layer comprises a blend of polymers with organic derivatives.

8. The device according to claim 1 wherein the polymer-based light emissive layer is doped with organic derivative compounds.

9. The device according to claim 1 wherein the polymer-based light emissive layer contains phosphorescent dopants.

10. The device according to claim 1 wherein the polymer-based light emissive layer comprises phosphorescence based materials.

11. The device according to claim 1 wherein the polymer-based light emissive layer is replaced by triplet emitters that are solution processible materials.

12. The device according to claim 1 wherein said small molecule-based light emissive layer comprises fluorescence based materials.

13. The device according to claim 1 wherein said small molecule-based light emissive layer is doped with organic derivatives.

14. The device according to claim 1 wherein said small molecule-based light emissive layer comprises phosphorescence based dopants.

15. The device according to claim 1 wherein said small molecule-based light emissive layer comprises phosphorescence based materials.

16. The device according to claim 1 wherein said small molecule-based light emissive layer is replaced by triplet emitters that can be thermally evaporated.

17. The device according to claim 1 wherein said small molecule-based light emissive layer is fabricated by at least one of: vacuum deposition, thermal evaporation or sputtering.

18. The device according to claim 1 wherein the polymer-based light emissive layer contains small molecular transport moieties.

19. The device according to claim 6, wherein the at least one non-conjugated polymer is selected from polystyrene, poly-vinyl carbazole, poly-vinyl acene, aromatic polyesters, polyimide and poly-benzo-siloles.

20. The device according to claim 1, wherein the charge transporting material includes polythiophene, derivatized polythiophene, oligomeric polythiophene, derivatized oligomeric polythiophene, pentacene, triphenylamine, or triphenyldiamine.

21. The device according to claim 1, wherein the conductivity dopants include one or more of ferric chloride, ferric bromide, antimony pentachloride, arsenic pentachloride or boron trifluoride.

22. The device according to claim 1, wherein the conductivity dopants include one or more of 2,3,5,6-tetrafluoro-7,7,8,8-tetracyano-quinodimethane, dicyanodichloroquinone or trinitrofluorenone.

23. The device according to claim 1 wherein said small molecule based light emissive layer is a hole blocking layer doped with at least one emissive dopant.

24. The device according to claim 1 wherein the polymer-based light emissive layer comprises triplet emmiters that are solution processible materials.

25. The device according to claim 1 wherein the molecule capable of charge transport is a small molecule.

26. The device according to claim 1 wherein the molecule capable of charge transport is a polymer.

* * * * *

UNITED STATES PATENT AND TRADEMARK OFFICE
CERTIFICATE OF CORRECTION

PATENT NO. : 7,679,282 B2  
APPLICATION NO. : 11/294904  
DATED : March 16, 2010  
INVENTOR(S) : Vi-En Choong et al.

Page 1 of 1

It is certified that error appears in the above-identified patent and that said Letters Patent is hereby corrected as shown below:

Column 7, Line 9 at Claim 1; replace:
"the polymer-based light ernissive layer; and" with
-- the polymer-based light emissive layer; and --

Column 8, Line 30 at Claim 21; replace:
"bromide, antimony pentachioride, arsenic pentachioride or" with
-- bromide, antimony pentachloride, arsenic pentachloride or --

Column 8, Line 40 at Claim 24; replace:
"based light emissive layer comprises triplet emmiters that are" with
-- based light emissive layer comprises triplet emitters that are --

Signed and Sealed this

Seventeenth Day of August, 2010

David J. Kappos
*Director of the United States Patent and Trademark Office*